(12) United States Patent
Matsuno et al.

(10) Patent No.: US 8,537,039 B2
(45) Date of Patent: Sep. 17, 2013

(54) DISTORTION CORRECTING DEVICE

(75) Inventors: Junya Matsuno, Kawasaki (JP); Tetsuro Itakura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/409,516

(22) Filed: Mar. 1, 2012

(65) Prior Publication Data

US 2013/0044016 A1 Feb. 21, 2013

(30) Foreign Application Priority Data

Aug. 15, 2011 (JP) ................................. 2011-177673

(51) Int. Cl.
*H03M 1/06* (2006.01)

(52) U.S. Cl.
USPC .......................................... 341/118; 341/155

(58) Field of Classification Search
USPC ........................ 341/118, 120, 155, 159, 139
See application file for complete search history.

(56) References Cited

U.S. PATENT DOCUMENTS

| | | | |
|---|---|---|---|
| 5,187,481 A * | 2/1993 | Hiller | 341/131 |
| 5,961,579 A * | 10/1999 | Pan et al. | 708/517 |
| 6,552,609 B2 * | 4/2003 | Hamada et al. | 330/149 |
| 7,126,508 B2 * | 10/2006 | Seki | 341/118 |
| 7,348,908 B2 | 3/2008 | Slavin | |

OTHER PUBLICATIONS

Y. Chung et al; IEE Journal of Solid-State Circuits, vol. 45, No. 11, Nov. 2010; A CMOS 6-mW 10-BIT 100-MS/s Two-Step ADC; pp. 2217-2226.
E. Keehr et al; IEEE International Solid-State Circuits Conference; 2008; Equalization of IM3 Products in Wideband Direct-Conversion Receivers; (3 pages).

* cited by examiner

*Primary Examiner* — Peguy Jean Pierre
(74) *Attorney, Agent, or Firm* — Holtz, Holtz, Goodman & Chick, P.C.

(57) ABSTRACT

There is provided a distortion correcting device in which a first A/D converter A/D converts a first input signal to obtain a first converted signal, a second A/D converter A/D converts a second input signal to obtain a second converted signal wherein the second input signal is a signal obtained by reducing an amplitude of the first input signal, or the first input signal is a signal obtained by increasing an amplitude of the second input signal, the exponentiator obtains an exponential signal by raising the second converted signal to an n-th power ("n" is an integer of 2 or more), a adaptive correlation controller carries out adaptive correlation control based on the exponential signal and the second converted signal to generate a distortion signal that is an n-th power component contained in the exponential signal, and a distortion remover removes the distortion signal from the first converted signal.

10 Claims, 5 Drawing Sheets

DISTORTION CORRECTING DEVICE

CROSS REFERENCE TO RELATED APPLICATIONS

This application is based upon and claims the benefit of priority from the prior Japanese Patent Application No. 2011-177673, filed on Aug. 15, 2011, the entire contents of which are incorporated herein by reference.

FIELD

Embodiments relate to a distortion correcting device of an A/D converter.

BACKGROUND

A technique for removing a distortion component from an output signal of an A/D converter (ADC) by a non-linear filter is known. Also, there is known a technique for removing third-order distortion by generating a cube component of a desired signal by a multiplier and subtracting the cube component from the desired signal.

However, the former technique requires a large-scale non-linear filter and is unrealistic. In the latter technique, high precision cannot be obtained since the distortion component is generated only by a multiplier of an analogue circuit.

DETAILED DESCRIPTION

There is provided a distortion correcting device including: a first A/D converter, a second A/D converter, an exponentiator, an adaptive correlation controller and a distortion remover.

The first A/D converter A/D converts a first input signal to obtain a first converted signal.

The second A/D converter A/D converts a second input signal to obtain a second converted signal. The second input signal is a signal obtained by reducing an amplitude of the first input signal, or the first input signal is a signal obtained by increasing an amplitude of the second input signal.

The exponentiator obtains an exponential signal by raising the second converted signal to an n-th power ("n" is an integer of 2 or more).

The adaptive correlation controller carries out adaptive correlation control based on the exponential signal and the second converted signal to generate a distortion signal that is an n-th power component contained in the exponential signal.

The distortion remover removes the distortion signal from the first converted signal.

Hereinafter, embodiments will be described with reference to the drawings.

[First Embodiment]

Figure 1:
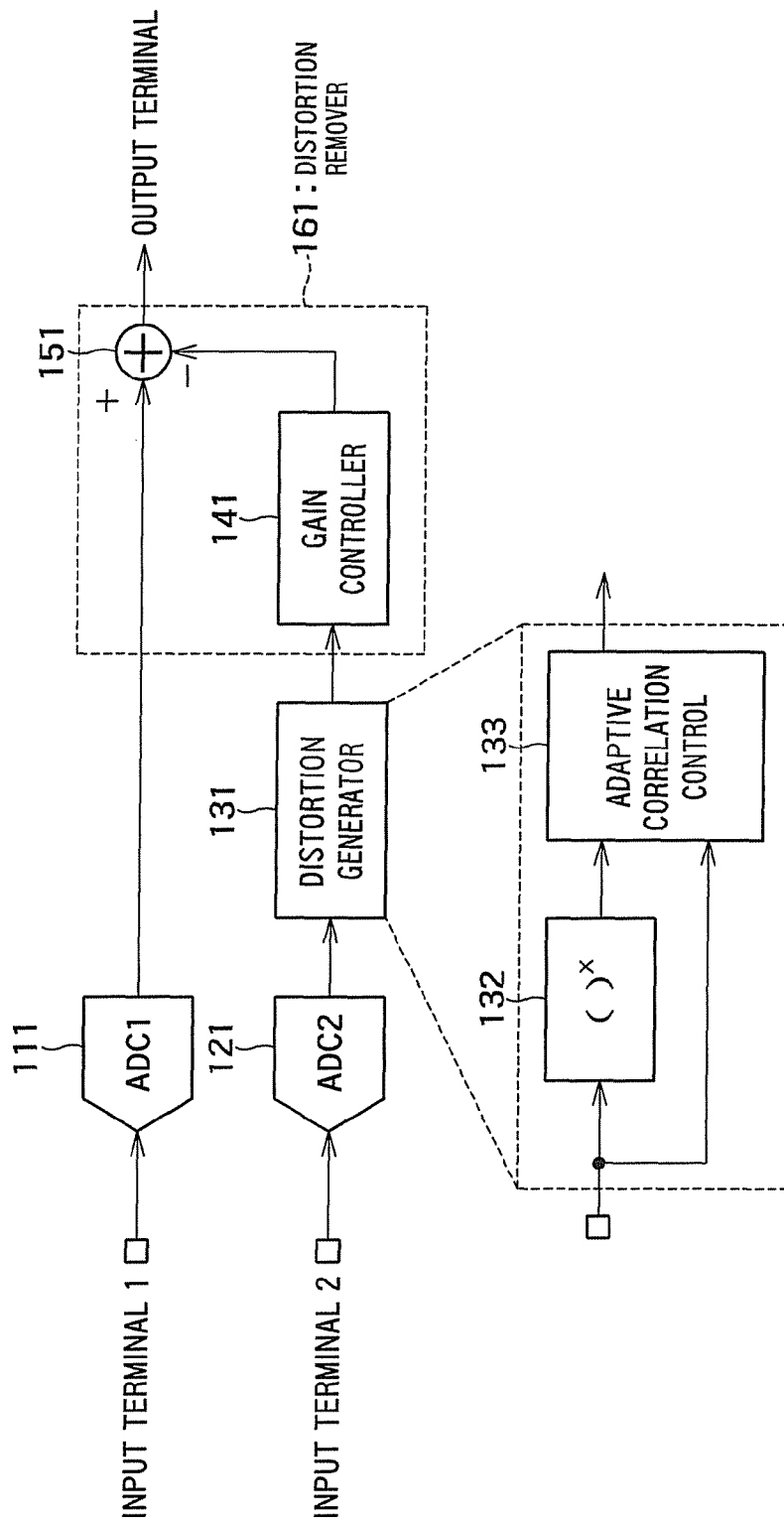
FIG. 1 is a block diagram of a distortion correcting device of an A/D converter according to an embodiment.

FIG. 1 shows a block diagram of a distortion correcting device of a time interleaved A/D converter according to the embodiment.

A first A/D converter 111 subjects an input signal (first input signal) to A/D conversion to obtain a first converted signal.

A second A/D converter 121 subjects an input signal (second input signal) to A/D conversion to obtain a second converted signal. The second input signal is a signal obtained by reducing the amplitude of the first input signal, or the first input signal is a signal obtained by increasing the amplitude of the second input signal. The distortion of the second converted signal is lower than that of the first converted signal.

The second A/D converter 121 has a dynamic range corresponding to the second input signal. The resolution capability of the second A/D converter 121 may be lower than that of the first A/D converter 111.

A distortion generator 131 generates a distortion signal from the second converted signal obtained by the second A/D converter 121.

A distortion remover 161 removes (cancels) the distortion signal, which has been generated by the distortion generator 131, from the first converted signal obtained by the first A/D converter 111. As a result, the distortion component contained in the first converted signal is removed. The first converted signal from which the distortion component has been removed is output from an output terminal.

The distortion generator 131 has an exponentiator 132 and an adaptive correlation controller 133.

The exponentiator 132 obtains an exponential signal by raising the second converted signal to the n-th power. "n" is an integer of 2 or higher and employs 2 or 3 in many cases. "n" is equal to 2 if a square component is desired to be removed as a distortion component, and "n" is equal to 3 if a cube component is desired to be removed. As described above, the distortion of the second converted signal is lower than that of the first converted signal, and such a low-distortion signal is exponentiated.

The adaptive correlation controller 133 carries out adaptive correlation control based on the exponential signal, which is the output of the exponentiator 132, and the second converted signal, thereby generating the distortion signal, which is the n-th power component contained in the exponential signal.

The distortion remover 161 has a gain controller 141 and a subtractor 151.

The gain controller 141 carries out gain control of the distortion signal output from the distortion generator 131. As a result, the electric power level of the distortion signal is adjusted to the level of the first converted signal. In other words, the distortion signal output by the distortion generator 131 is amplified in accordance with the amplitude of the first converted signal.

The subtractor 151 subtracts the gain-controlled distortion signal from the first converted signal which is the output of the first A/D converter 111. As a result, a low-distortion AD converted signal that the distortion component has been removed from the first converted signal is obtained.

As described above, in the present configuration, the small-amplitude signal (second input signal) is subjected to A/D conversion, and the distortion signal is generated based on the adaptive correlation between the A/D converted signal and the n-th power signal thereof. Then, the distortion signal is multiplied by an appropriate gain control value and subtracted from the signal line of the first A/D converter 111 (the signal on the line between the ADC 111 and the subtractor 151). As a result, the distortion contained in the first converted signal output from the first A/D converter 111 can be removed.

As described above, according to the present embodiment, area-reduction can be achieved since distortion removal can be realized by the A/D converters and the adaptive correlation controller compared with the conventional method that uses a large-scale non-linear filter as a distortion corrector.

The second A/D converter is only required to have the dynamic range corresponding to the low-amplitude signal (second input signal). Therefore, the second A/D converter can be implemented with a smaller area and lower power consumption compared with the first A/D converter.

Furthermore, when the resolution capability of the second A/D converter is lower than that of the first A/D converter, the second A/D converter can be implemented with a smaller area and lower power consumption compared with the first A/D converter.

[Second Embodiment]

Figure 2:
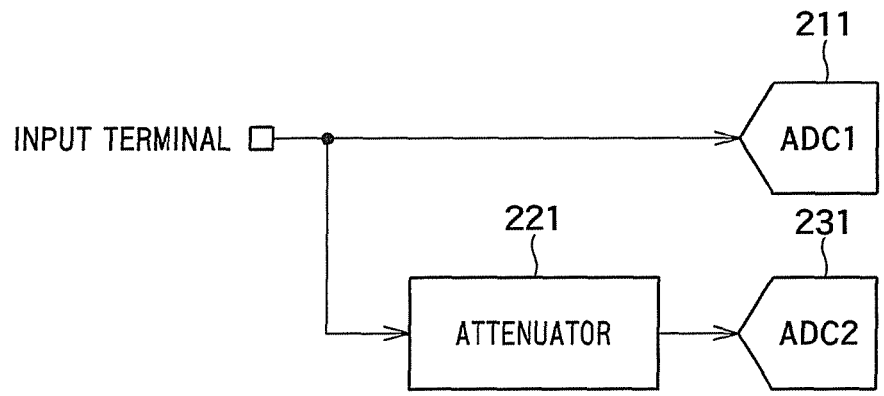
FIG. 2 is a block diagram showing a previous stage of first and second A/D converters.

FIG. 2 shows a configuration example of a previous stage of the first A/D converter and the second A/D converter.

The signal received by an input terminal is input without change to a first A/D converter 211 as a first input signal.

The signal received by the input terminal is attenuated by an attenuator 221 and input to a second A/D converter 231 as a second input signal. In this manner, the second input signal can be generated by attenuating the first input signal by the attenuator 221.

[Third Embodiment]

Figure 3:
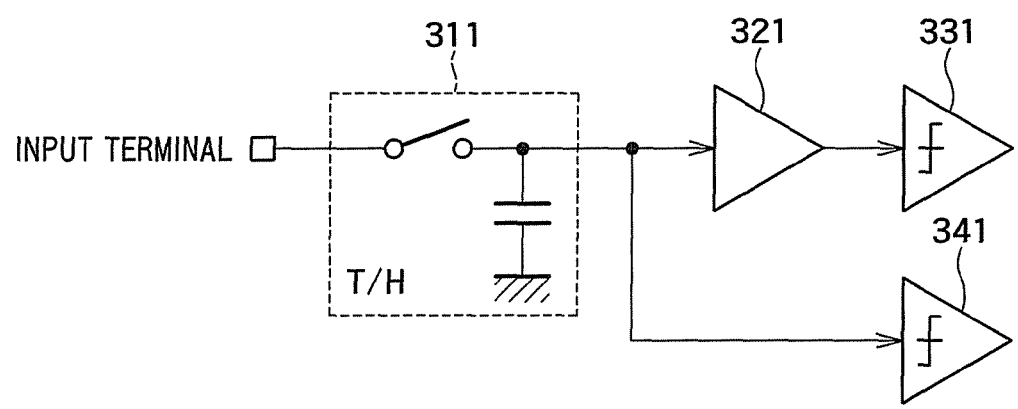
FIG. 3 is a block diagram showing the first and second converters and the configuration of the previous stage thereof.

FIG. 3 shows a specific configuration example of the first A/D converter, the second A/D converter, and the configuration of the previous stage thereof.

A track and hold (T/H) circuit 311 discretizes at a clock frequency the input signal received by the input terminal.

The first A/D converter includes an amplifier 321 and a comparator 331. The second A/D converter includes a comparator 341.

The amplifier 321 amplifiers the output of the T/H circuit 311 to a desired signal amplitude and outputs it as the first input signal.

The comparator 331 compares the output signal (first input signal) of the amplifier 321 with a first threshold value and outputs a first digital signal (first converted signal).

The comparator 341 compares the second input signal, which is the output of the T/H circuit 311, with a second threshold value and outputs it as a second digital signal (second converted signal).

According to the distortion correcting device provided with the above described configuration, the distortion generated in the amplifier 321 can be corrected by the distortion generator 131 and the distortion remover 161 (see FIG. 1). Since the amplifier is provided in the A/D converter, the attenuator described in the second embodiment becomes unnecessary.

[Fourth Embodiment]

Figure 4:
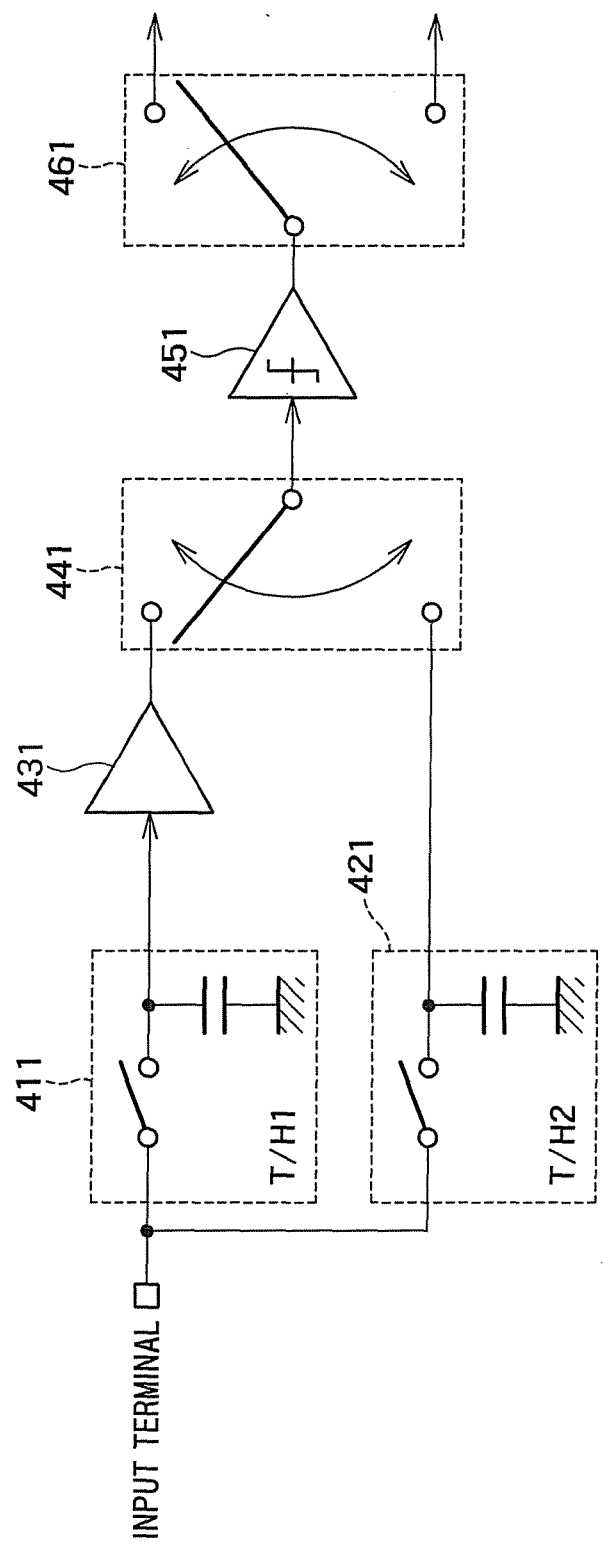
FIG. 4 is a block diagram showing the first and second A/D converters and the previous stage thereof.

FIG. 4 shows another configuration example of the first A/D converter, the second A/D converter, and the configuration of the previous stage thereof.

A first track and hold circuit 411 discretizes the input signal, which is received by an input terminal, at half a clock frequency and outputs it.

A second track and hold circuit 421 discretizes the input signal by a cycle of which phase is different from that of the first track and hold circuit 411 by 180 degrees and outputs it.

An amplifying unit 431 amplifies the output signal of the first track and hold circuit 411 to a desired signal amplitude and outputs it.

A multiplexer 441 switches by a clock cycle the output signal of the amplifying unit 431 and the output signal of the second track and hold circuit 421 and outputs it.

A comparing unit 451 receives the output signal of the multiplexer 441, compares the output signal with a certain threshold value, and outputs a digital signal.

A demultiplexer 461 receives the output (digital signal) of the comparing unit 451 and switches outputting destinations by the clock cycle, thereby obtaining two outputs (first output, second output). The first output corresponds to the output of the first A/D converter 111 described in the first embodiment, and the second output corresponds to the output of the second A/D converter 121 described in the first embodiment.

When two track and hold circuits are prepared in this manner, the operating frequency of each of them can be reduced by half, and the power consumption of an input buffer which drives the track and hold circuit can be reduced.

By using the multiplexer and the demultiplexer, the A/D converter (comparing unit 461) can be shared and thereby area-reduction can be achieved.

[Fifth Embodiment]

Figure 5:
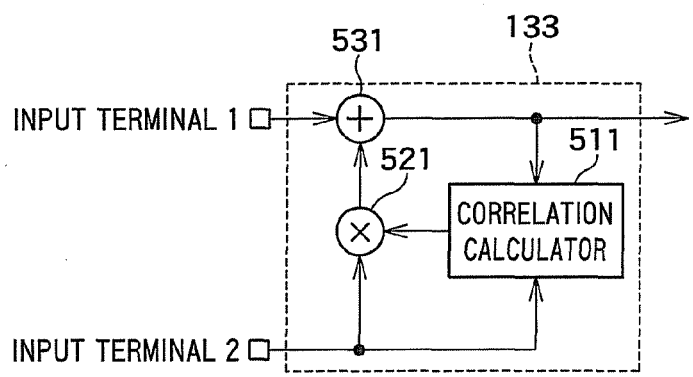
FIG. 5 is a block diagram showing an adaptive correlation controller.

FIG. 5 shows a configuration example of the adaptive correlation controller 133 shown in FIG. 1.

The adaptive correlation controller 133 is provided with a correlation calculator 511, a multiplier (first multiplier) 521, and a subtracting unit 531. The output (exponential signal) of the exponentiator 132 shown in FIG. 1 is input to an input terminal 1. The second converted signal, which is the output of the second A/D converter, is input to an input terminal 2.

The correlation calculator 511 calculates the correlation of the output of the subtracting unit 531 (corresponding to the output of the adaptive correlation controller 133) and the second converted signal input from the input terminal 2 and outputs a correlation value.

The multiplier 521 multiplies the second converted signal, which is input from the input terminal 2 by the output (correlation value) of the correlation calculator 511, and outputs a multiplication signal (first multiplication signal).

The subtracting unit 531 subtracts the output (first multiplication signal) of the multiplier 521 from the exponential signal input from the input terminal 1 and outputs a subtracted signal (distortion signal).

[Sixth Embodiment]

Figure 6:
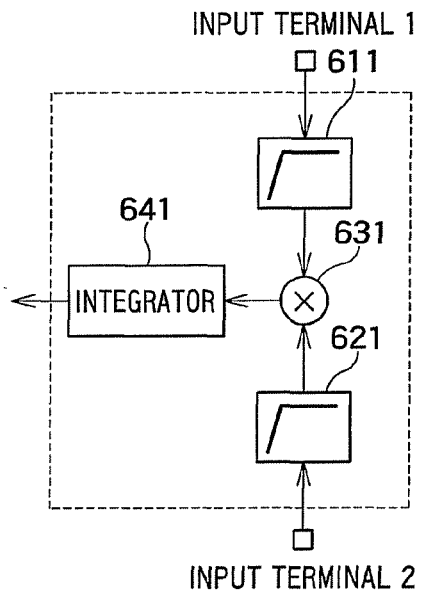
FIG. 6 is a block diagram showing a correlation calculator.

FIG. 6 shows a configuration example of the correlation calculator 511 shown in FIG. 5.

The correlation calculator 511 is provided with a first low-frequency remover 611, a second low-frequency remover 621, a multiplier (second multiplier) 631, and an integrator 641. The output signal of the subtracting unit 531 shown in FIG. 5 is input to an input terminal 1. The second converted signal is input to an input terminal 2.

The first low-frequency remover 611 removes a low-frequency signal from the output signal of the subtracting unit 531 input to the input terminal 1 to obtain a first signal.

The second low-frequency remover 621 removes a low-frequency signal from the second converted signal input to the input terminal 2 to obtain a second signal.

The multiplier 631 multiplies the output signal (first signal) of the first low-frequency remover 611 by the output signal (second signal) of the second low-frequency remover 621, and outputs a multiplication signal (second multiplication signal).

The integrator 641 integrates the output (second multiplication signal) of the multiplier. The output of the integrator 641 serves as the output of the correlation calculator 511.

[Seventh Embodiment]

Figure 7:
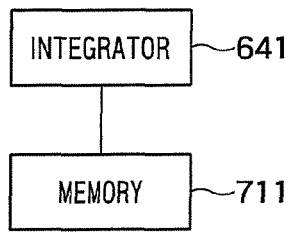
FIG. 7 is a block diagram showing a correlation calculator.

FIG. 7 shows a partial modification example of the correlation calculator shown in FIG. 6.

A memory 711 is provided, and the memory 711 is connected to the integrator 641.

When power is turned on (i.e., upon start-up), a signal such as a training signal is used as the signal input to this device, and the integrator carries out calculation. The output value (initial value) of the integrator obtained in this process is stored in the memory 711. Upon normal operation after the start-up, the calculation at the integrator 641 is omitted, and the value stored in the memory 711 is used. As a result, the convergence time of the integrator 641 can be shortened, and high-speed operation can be carried out.

[Eighth Embodiment]

Figure 8:
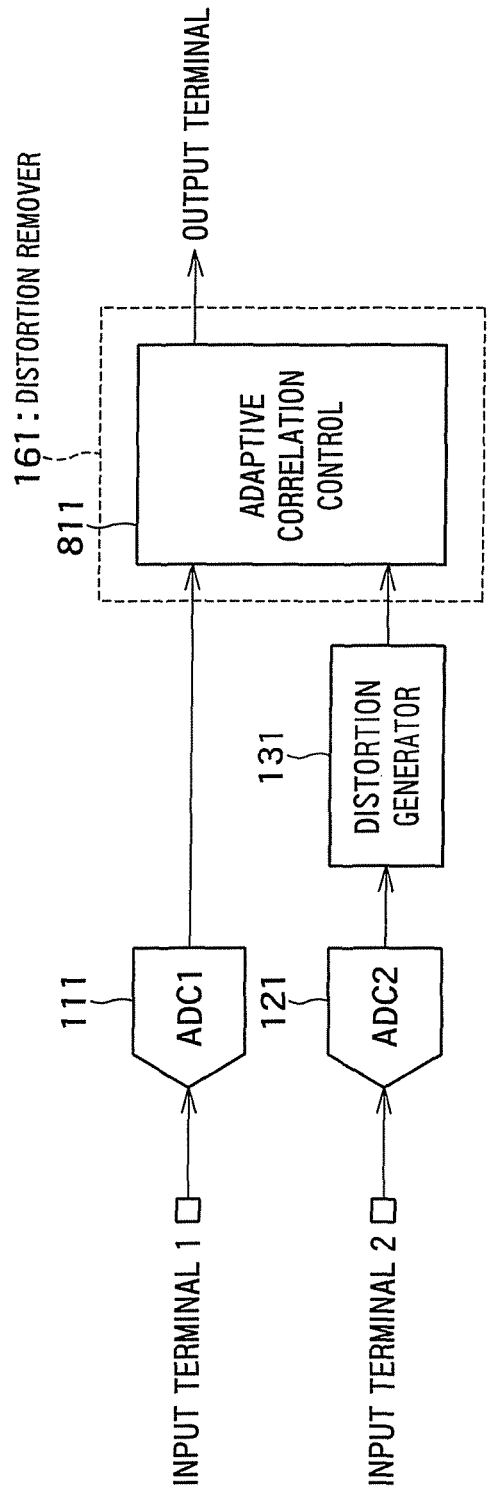
FIG. 8 is a block diagram showing a distortion remover.

FIG. 8 shows another configuration example of the distortion remover 161.

The distortion remover 161 of FIG. 8 is provided with an adaptive correlation controller 811 instead of the gain controller 141 and the subtractor 151 shown in FIG. 1.

The adaptive correlation controller 811 removes the distortion component contained in the first converted signal by carrying out adaptive correlation control based on the first converted signal, which is the output of the first A/D converter 111, and the distortion signal, which is the output of the distortion generator 131, and outputs the signal from which the distortion component has been removed. In this manner, the configuration of the distortion remover is not limited to the configuration shown in FIG. 1, but various configurations can be implemented.

The present invention is not limited to the exact embodiments described above and can be embodied with its components modified in an implementation phase without departing from the scope of the invention. Also, arbitrary combinations of the components disclosed in the above-described embodiments can form various inventions. For example, some of the all components shown in the embodiments may be omitted. Furthermore, components from different embodiments may be combined as appropriate.

The invention claimed is:

1. A distortion correcting device comprising:
a first A/D converter configured to A/D convert a first input signal to obtain a first converted signal;
a second A/D converter configured to A/D convert a second input signal to obtain a second converted signal, wherein the second input signal is a signal obtained by reducing an amplitude of the first input signal, or the first input signal is a signal obtained by increasing an amplitude of the second input signal;
an exponentiator configured to obtain an exponential signal by raising the second converted signal to an n-th power ("n" is an integer of 2 or more);
an adaptive correlation controller configured to carry out adaptive correlation control based on the exponential signal and the second converted signal to generate a distortion signal that is an n-th power component contained in the exponential signal; and
a distortion remover configured to remove the distortion signal from the first converted signal.

2. The device according to claim 1, wherein
the distortion remover removes the distortion signal from the first converted signal by carrying out adaptive correlation control based on the first converted signal and the distortion signal.

3. The device according to claim 1, wherein
the distortion remover includes
a gain controller configured to control gain of the distortion signal and
a subtractor configured to subtract the gain-controlled distortion signal from the first converted signal.

4. The device according to claim 1, wherein,
the second A/D converter has a dynamic range corresponding to the second input signal.

5. The device according to claim 1, wherein
the second A/D converter has a lower resolution capability than that of the first A/D converter.

6. The device according to claim 1, further comprising
an attenuator configured to reduce the amplitude of the first input signal to obtain the second input signal.

7. The device according to claim 1, further comprising
a track and hold circuit configured to discretize an input signal at a clock frequency to obtain a discretized signal; wherein
the first A/D converter includes
an amplifier configured to amplify the discretized signal to obtain the first input signal and
a first comparator configured to compare the first input signal with a first threshold value to obtain the first converted signal; and
the second A/D converter includes
a second comparator configured to compare the second input signal that is the discretized signal with a second threshold value to obtain the second converted signal.

8. The device according to claim 1, wherein
the adaptive correlation controller includes
a correlation calculator configured to calculate correlation between the distortion signal and the second converted signal to obtain a correlation value;
a first multiplier configured to multiply the second converted signal by the correlation value to obtain a first multiplication signal; and
a subtracting unit configured to subtract the first multiplication signal from the exponential signal to obtain the distortion signal.

9. The device according to claim 8, wherein
the correlation calculator includes
a first low-frequency remover configured to remove a low-frequency component from the distortion component to obtain a first signal;
a second low-frequency remover configured to remove a low-frequency component from the second converted signal to obtain a second signal;
a second multiplier configured to multiply the first signal by the second signal to obtain a second multiplication signal; and
an integrator configured to integrate the second multiplication signal to obtain the correlation value.

10. The device according to claim 9, further comprising
a memory to store the correlation value obtained by the integrator; wherein
the integrator calculates, upon start-up, the correlation value and stores the calculated correlation value in the memory; and
the first multiplier uses, upon normal operation after the start-up, the correlation value stored in the memory.

* * * * *